United States Patent [19]
Mori

[11] Patent Number: 5,949,098
[45] Date of Patent: Sep. 7, 1999

[54] SEMICONDUCTOR INTEGRATED CIRCUIT HAVING AN IMPROVED ARRANGEMENT OF POWER SUPPLY LINES TO REDUCE NOISE OCCURRING THEREIN

[75] Inventor: Hiroyuki Mori, Tokyo, Japan

[73] Assignee: Oki Electric Industry Co., Ltd., Tokyo, Japan

[21] Appl. No.: 08/868,474

[22] Filed: Jun. 3, 1997

Related U.S. Application Data

[63] Continuation of application No. 08/658,153, Jun. 4, 1996, abandoned.

[30] Foreign Application Priority Data

Jun. 15, 1995 [JP] Japan ................................. 7-148627
Aug. 30, 1995 [JP] Japan ................................. 7-222025

[51] Int. Cl.⁶ ............................................. H01L 27/118
[52] U.S. Cl. ...................... 257/211; 257/207; 257/758
[58] Field of Search .................................. 257/691, 758, 257/506, 202–211, 207

[56] References Cited

U.S. PATENT DOCUMENTS

| | | | |
|---|---|---|---|
| T101,804 | 5/1982 | Balyoz et al. | 257/204 |
| 3,643,232 | 2/1972 | Kilby | 257/205 |
| 4,136,356 | 1/1979 | Kusano | 257/203 |
| 4,731,643 | 3/1988 | Dunham et al. | 257/203 |
| 4,780,753 | 10/1988 | Ohkura et al. | 257/206 |
| 4,847,732 | 7/1989 | Stopper et al. | 257/50 |
| 4,853,757 | 8/1989 | Kuramitsu et al. | 257/203 |
| 4,862,241 | 8/1989 | Ashida et al. | 257/204 |
| 4,914,503 | 4/1990 | Shirato et al. | 257/691 |
| 4,916,521 | 4/1990 | Yoshikawa | 257/774 |
| 4,965,651 | 10/1990 | Wagner | 257/206 |
| 4,999,698 | 3/1991 | Okuno et al. | 257/206 |
| 5,008,728 | 4/1991 | Yamamura et al. | 257/207 |
| 5,063,433 | 11/1991 | Matsuo et al. | 257/211 |
| 5,225,693 | 7/1993 | Hirayama | 257/204 |
| 5,298,773 | 3/1994 | Woodruff | 257/202 |
| 5,309,024 | 5/1994 | Hirano | 257/691 |
| 5,355,023 | 10/1994 | Tomioka et al. | 257/774 |
| 5,404,045 | 4/1995 | Mizushima | 257/698 |
| 5,452,245 | 9/1995 | Hickman et al. | 257/206 |
| 5,493,135 | 2/1996 | Yin | 257/202 |
| 5,598,029 | 1/1997 | Suzuki | 257/665 |

FOREIGN PATENT DOCUMENTS 5-283615  10/1993  Japan .

OTHER PUBLICATIONS

A 5000MHz 32b 0.4μm CMOS RISC Processor LSI, Kazumasa Suzuki, et al, 1994 IEEE Int'l. Solid–State Circuits Conference, Session 12 (Microprocessors/Paper TP 12.7), pp. 214–215, 341.
A 500–MHz, 32–b, 0.4–μm CMOS RISC Microprocessor, K. Suzuki, et al, Technical Report of IEICE, pp. 43–50 (in Japanese with English language Abstract).

*Primary Examiner*—David B. Hardy

[57] ABSTRACT

A semiconductor integrated circuit is capable of reducing noise which occurs when, for example, power is removed from the circuit. The semiconductor integrated circuit includes a power wiring layer 110 used for a power conductive line 111, a first insulating layer 120 for providing electrical isolation between the power wiring layer 110 and a ground wiring layer 130 and having a through hole 121 therein enabling electrical connection between the power conductive line 111 and a first signal conductive line 151. The ground wiring layer 130 is used for each ground conductive line 132. The circuit also includes a power conductive line 131 so as to allow an electrical connection between the power conductive line 111 and the first signal conductive line 151, a second insulating layer 140 capable of providing electrical isolation between the ground conductive line 130 and a signal wiring layer 150, having a through hole 141 therein enabling an electrical connection between the power conductive line 111 and the first signal conductive line 151. The circuit further includes a through hole 142 defined therein enabling an electrical connection between the ground conductive line 132 and a second signal conductive line 152. The circuit also includes signal wiring layer 150 having first, second and third signal conductive lines 151, 152 and 153.

8 Claims, 3 Drawing Sheets

SEMICONDUCTOR INTEGRATED CIRCUIT HAVING AN IMPROVED ARRANGEMENT OF POWER SUPPLY LINES TO REDUCE NOISE OCCURRING THEREIN

This application is a Continuation of application Ser. No. 08/658,153, filed Jun. 4, 1996, now abandoned.

BACKGROUND OF THE INVENTION

1. Field of the Invention

This invention relates to a semiconductor integrated circuit having an improved arrangement of power supply lines in order to reduce noise occurring therein by taking advantage of a capacitance which exists between the power supply lines.

2. Description of the Related Art

Generally, when a semiconductor integrated circuit becomes inactive noise which is caused by a change in the voltage potential of the power supply line occurs. The noise influences the operation of the semiconductor integrated circuit. In order to reduce such noise, a variety of proposals have been offered. Of these, for example, one is mentioned wherein a de-coupling capacitor (in other words, by-pass condenser) is coupled to the integrated circuit. Alternatively, another proposal is disclosed in Japanese Patent Application Laid-Open No. 5 (1993)-283615 published on Oct. 29, 1993.

SUMMARY OF THE INVENTION

With the foregoing in mind, it is an object of the present invention to provide a semiconductor integrated circuit which reduces the noise that occurs therein.

It is another object of the present invention to provide a semiconductor integrated circuit having an improved arrangement of power supply lines.

According to one aspect of the present invention, for achieving the above objects, there is provided a semiconductor integrated circuit which includes a first power supplying line formed in a first conductive layer, for supplying a first power voltage; a first insulating layer formed on the first conductive layer; a second power supplying line formed in a second conductive layer which is formed on the first insulating layer and extending along the first conductive line, for supplying a second power voltage less than the first power voltage; a second insulating layer formed on the second conductive layer; a first signal line formed in a third conductive layer which is formed on the second insulating layer and connected to the first power supplying line through a first contact hole; and a second signal line formed in the third conductive layer and connected to the second power supplying line through a second contact hole.

According to the above construction of the present invention, the semiconductor integrated circuit can be realized which reduces noise occurred therein.

This and other aspects of the present invention will be understood from the appended claims, the following embodiments and the accompanying drawings.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

A first embodiment of the present invention will first be described with reference to FIG. 1.

Figure 1:
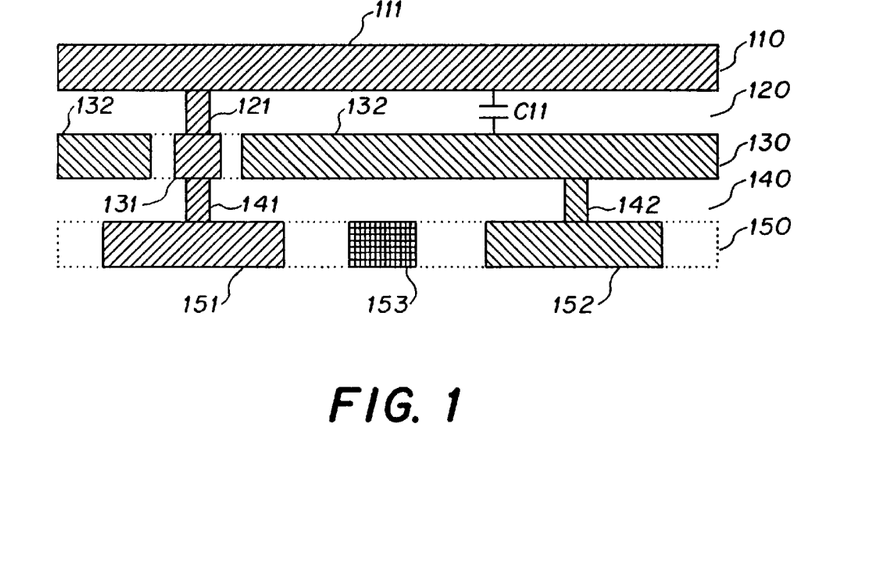
FIG. 1 is a cross-sectional view of a semiconductor integrated circuit according to a first embodiment of the present invention.

FIG. 1 is a cross-sectional view of a semiconductor integrated circuit showing the first embodiment of the present invention.

As shown in FIG. 1, the semiconductor integrated circuit comprises, in order from the uppermost layer, a power wiring layer 110 used for a power conductive line 111, a first insulating layer 120 capable of electrically insulating the power wiring layer 110 from a ground wiring layer 130 and having a through hole 121 defined therein so as to enable an electrical connection between the power conductive line 111 and a first signal conductive line 151, the ground wiring layer 130 used for each of ground conductive lines 132 and having a power conductive line 131 so as to allow an electrical connection between the power conductive line 111 and the first signal conductive line 151, a second insulating layer 140 capable of providing electrical isolation between the ground conductive line 130 and a signal wiring layer 150, having a through hole 141 defined therein so as to enable an electrical connection between the power conductive line 111 and the first signal conductive line 151 and having a through hole 142 defined therein so as to enable an electrical connection between the ground conductive line 132 and a second signal conductive line 152, and the signal wiring layer 150 used for the signal conductive lines and composed of the first signal conductive line 151, the second signal conductive line 152 and a third signal conductive line 153.

In order to supply a power potential or a ground potential to the respective signal conductive lines, the power conductive line 111 and the first signal conductive line 151 may be connected to one another when the first signal conductive line 151 is fixed to the power potential. Described specifically, the supply of the power potential to each signal conductive line is carried out through the through hole 121, the power conductive line 131 and the through hole 141. When the second signal conductive line is fixed to the ground potential, the supply of the ground potential to each signal conductive line is performed via the through hole 142.

In the first embodiment, a by-pass capacitor or condenser is formed by a capacitance created by the power conductive line 111 and the ground conductive line 132 both provided so as to be superimposed on one another.

The operation of the semiconductor integrated circuit will be described below.

In the semiconductor integrated circuit according to the first embodiment of the present invention, as described above, the two wiring layers as seen below from the uppermost wiring layer, i.e., the power wiring layer 110 and the ground wiring layer 130 are used for power and ground conductive lines, whereas the wiring layers below the ground wiring layer 130 are utilized for signal conductive lines.

In the structure referred to above, the capacitance, which functions as the de-coupling capacitor (or by-pass condenser), principally becomes a capacitance C11 formed between the power conductive line 111 and the ground conductive line 132. Power and ground noise can be reduced by increasing the capacitance as large as possible.

A second embodiment of the present invention will next be described.

Figure 2:
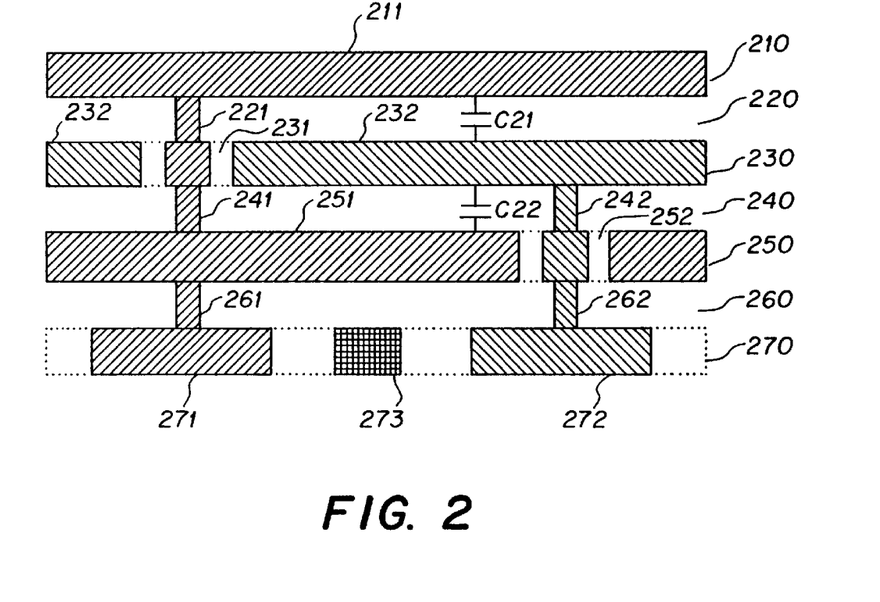
FIG. 2 is a cross-sectional view of a semiconductor integrated circuit according to a second embodiment of the present invention.

FIG. 2 is a cross-sectional view of a semiconductor integrated circuit showing the second embodiment of the present invention.

The present embodiment comprises, in order from the uppermost layer, a first power wiring layer 210 used for a power conductive line 211, a first insulating layer 220 capable of electrically insulating the first power wiring layer 210 from a ground wiring layer 230 and having a through hole 221 defined therein so as to enable an electrical connection between the power conductive line 211 and a power conductive line 251, the ground wiring layer 230 used for each of ground conductive lines 232 and having a power conductive line 231 so as to enable an electrical connection between the power conductive lines 211 and 251, a second insulating layer 240 capable of providing electrical isolation between the ground wiring layer 230 and a second power wiring layer 250, having a through hole 241 defined therein so as to enable an electrical connection between the power conductive line 211 and a first signal conductive line 271 and having a through hole 242 defined therein so as to allow an electrical connection between the ground conductive line 232 and a second signal conductive line 272, the second power wiring layer 250 used for the power conductive line 251 and having a ground conductive line 252 so as to enable an electrical connection between the ground conductive line 232 and the second signal conductive line 272, a third insulating layer 260 capable of providing electrical isolation between the second power wiring layer 250 and a signal wiring layer 270, having a through hole 261 defined therein for electrically connecting the power conductive line 251 and the first signal conductive line 271 to each other and having a through hole 262 defined therein for electrically connecting the ground conductive line 252 and the second signal conductive line 272 to each other, and the signal wiring layer 270 used for the signal conductive lines and composed of the first signal conductive line 271, the second signal conductive line 271 and a third signal conductive line 273.

In order to supply a power potential or a ground potential to the individual signal conductive lines, the power conductive line 251 and the first signal conductive line 271 may be connected to one another when the first signal conductive line 271 is fixed to the power potential. That is, the supply of the power potential to each signal conductive line is performed via the through hole 261. On the other hand, when the second signal conductive line 272 is fixed to the ground potential, the ground conductive line 232 and the second signal conductive line 272 may be connected to each other. That is, the supply of the ground potential to each signal conductive line is performed via the through hole 242, the ground conductive line 252 and the through hole 262.

In the second embodiment, a by-pass capacitor or condenser is formed by first and second capacitances created between the ground conductive line 232 and the power conductive lines 211 and 251 respectively disposed so as to be superimposed on the upper and lower layers of the ground conductive line 232.

The operation of the semiconductor integrated circuit shown in FIG. 2 will be described below. In the second embodiment of the present invention as described above, the three wiring layers extending downward from the uppermost wiring layer, i.e., the first power wiring layer 210, the ground wiring layer 230 and the second power wiring layer 250 are used for the power and ground conductive lines. Further, the wiring layers placed below the second power wiring layer 250 are used for the signal conductive lines.

In the structure referred to above, the capacitance, which serves as the by-pass condenser, is principally obtained as the total capacitance obtained by adding a capacitance C21 formed between the power conductive line 211 and the ground conductive line 232 and a capacitance C22 formed between the power conductive line 251 and the ground conductive line 232. Power and ground noise can be reduced by increasing the total capacitance as large as possible.

Although the power and ground conductive lines are formed by the three wiring layers in the present embodiment, they may be constructed of wiring layers greater than the three, for example, five wiring layers.

A third embodiment of the present invention will next be described.

Figure 3:
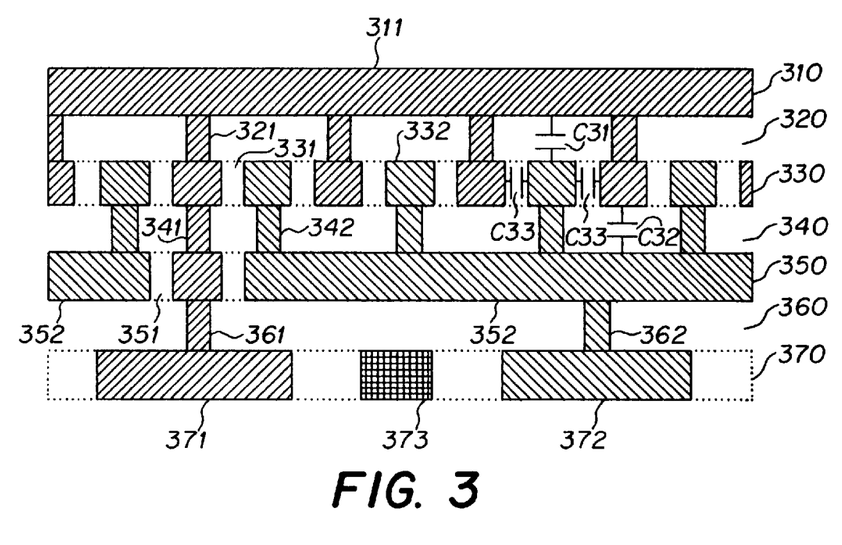
FIG. 3 is a cross-sectional view of a semiconductor integrated circuit according to a third embodiment of the present invention.

FIG. 3 is a sectional view of a semiconductor integrated circuit illustrating the third embodiment of the present invention.

As shown in the drawing, the present embodiment comprises, in order from the uppermost layer, a power wiring layer 310 used for a power conductive line 311, a first insulating layer 320 capable of providing electrical isolation between the power wiring layer 310 and a power/ground wiring layer 330 and having through holes 321 each defined therein so as to enable an electrical connection between the power conductive line 311 and one of power conductive lines 331, the power/ground wiring layer 330 used for both the power conductive lines 331 to be connected to the power conductive line 311 and ground conductive lines 332 to be connected to each of ground conductive lines 352, a second insulating layer 340 capable of electrically providing electrical isolation between the power/ground wiring layer 330 and a ground wiring layer 350, having a through hole 341 defined therein for connecting each of the power conductive lines 331 and a power conductive line 351 to each other and having through holes 342 defined therein for providing connections between the ground conductive lines 332 and each ground conductive line 352, the ground wiring layer 350 used for the ground conductive lines 352 and having the power conductive line 351 for providing an electrical connection between each of the power conductive lines 331 and a first signal conductive line 371, a third insulating layer 360 capable of providing electrical isolation between the ground wiring layer 350 and a signal wiring layer 370, having a through hole 361 defined therein for connecting the power conductive line 351 and the first signal conductive line 371 to each other and having a through hole 362 defined therein for connecting each of the ground conductive lines 352 and a second signal conductive line 372 to each other, and the signal wiring layer 370 used for the signal conductive lines and composed of the first signal conductive line 371, the second signal conductive line 372 and a third signal conductive line 373.

In order to supply a power potential or a ground potential to the individual signal conductive lines, the power conductive line 311 and the first signal conductive line 371 may be connected to each other when the first signal conductive line 371 is fixed to the power potential. That is, the supply of the power potential to each signal conductive line is performed via the through holes 321, the power conductive line 331, the through hole 341, the power conductive line 351 and the through hole 361. On the other hand, when the second signal conductive line 372 is fixed to the ground potential, the ground conductive line 352 and the second signal conductive line 372 may be connected to each other. That is, the supply of the ground potential to each signal conductive line is performed via the through hole 362.

In the third embodiment, a by-pass condenser is formed of capacitances created between the power conductive line 311 and each ground conductive line 352 disposed so as to overlap and those between the power conductive lines 331 and the ground conductive lines 332 disposed alternately to each other within the layers between the power conductive line 311 and each ground conductive line 352 so that they form projections and depressions between the power conductive line 311 and each ground conductive line 352.

The operation of the present semiconductor integrated circuit will be described below.

In the third embodiment of the present invention as described above, the three wiring layers extending downward from the uppermost wiring layer, i.e. the power wiring layer 310, the power/ground wiring layer 330 and the ground wiring layer 350 are used for the power and ground conductive lines. Further, the wiring layers placed below the ground wiring layer 350 are used for the signal conductive lines.

In the present structure, the capacitance, which serves as the by-pass condenser, principally becomes the total capacitance obtained by adding a capacitance C31 formed between the power conductive line 311 and each ground conductive line 332, a capacitance C32 formed between each power conductive line 331 and each ground conductive line 352, and a capacitance C33 formed between each power conductive line 331 and each ground conductive line 332. Power and ground noise can be reduced by increasing the total capacitance as large as possible.

In the first through third embodiments referred to above, the power conductive line may be replaced by the ground conductive line.

Figure 4:
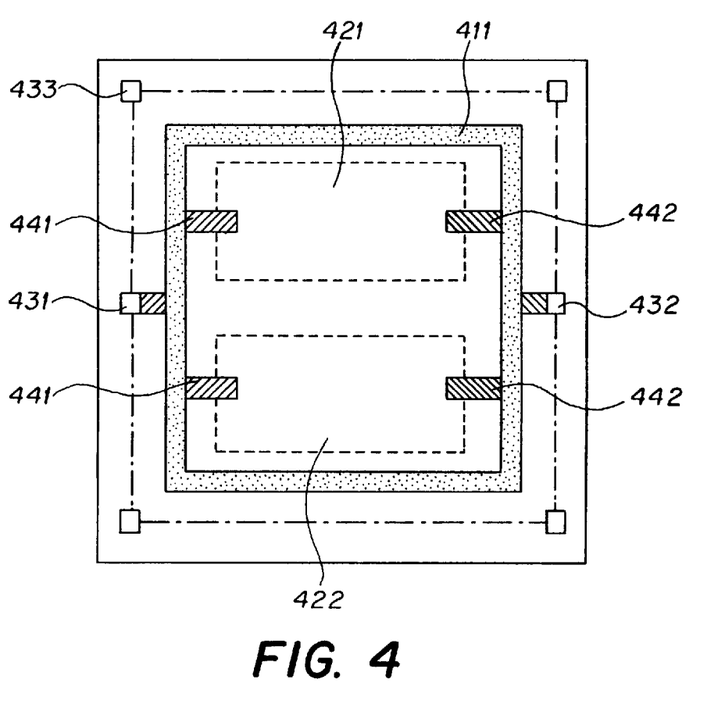
FIG. 4 is a layout of power supply lines of a semiconductor integrated circuit according to a fourth embodiment of the present invention.

A fourth embodiment of the present invention will next be described. FIG. 4 is a chip layout illustrating the fourth embodiment of the present invention.

In the present embodiment, the chip layout is configured using the power/ground conductive line employed in any one of the first through third embodiments of the semiconductor integrated circuits according to the present invention.

The fourth embodiment is configured so as to have a sectional structure of any one of the first through third embodiments of the present invention. The fourth embodiment comprises a power/ground conductive line 411 provided in a ring form inside a power pad 431, a ground pad 432 and input/output pads 433, which are provided around a chip, circuit cells 421 and 422 capable of electrically operating by being supplied with power and ground potentials and each having an in-cell power conductive line and an in-cell ground conductive line for respectively supplying the power and ground potentials, and power and ground conductive lines 441 and 442 for respectively supplying the power and ground potentials from the power and ground pads 431 and 432, the input/output pads 433 for respective input/output signals and the power/ground conductive line 411 to the circuit cells 421 and 422.

In order to supply the power and ground potentials to the circuit cells 421 and 422 respectively, the power/ground conductive line 411 may be connected to the in-cell power conductive line and in-cell ground conductive line of each circuit cell in the shortest distance through the power and ground conductive lines 441 and 442.

The operation of the present semiconductor integrated circuit will be described below.

In the fourth embodiment, a by-pass condenser is configured by providing the power/ground conductive line 411 in the form of a ring around the chip. Flower and ground noise can be reduced by increasing an area occupied by the power/ground conductive line 411 as large as possible.

Figure 5:
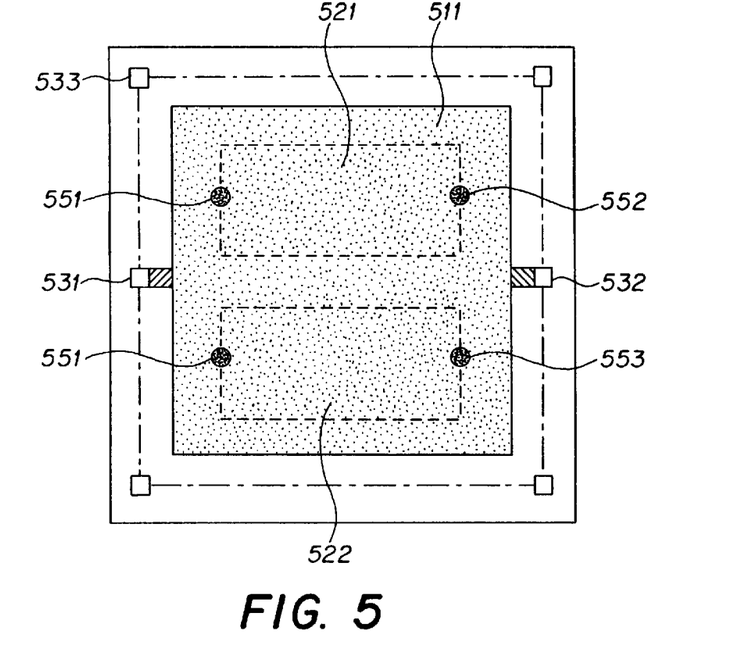
FIG. 5 is a layout of a semiconductor integrated circuit according to a fifth embodiment of the present invention.

FIG. 5 is a chip layout showing a fifth embodiment of the present invention.

In the present embodiment, the chip layout is configured using the power/ground conductive line employed in any one of the first through third embodiments of the semiconductor integrated circuits of the present invention.

The present embodiment is constructed so as to have a sectional structure of any one of the first through third embodiments of the present invention. The present embodiment comprises a power/ground conductive line 511 disposed entirely inside a power pad 531, a ground pad 532 and input/output pads 533, which are provided around a chip, circuit cells 521 and 522 capable of electrically operating by being supplied with power and ground potentials, each having an in-cell power conductive line and an in-cell ground conductive mine for respectively supplying the power and ground potentials, and provided in wiring layers unemployed in the power/ground conductive line 511, and through holes 551 and 552 for respectively connecting the power and ground pads 531 and 532, the input/output pads 533 for respective input/output signals and the power/ground line 511 to the in-cell power conductive line and the in-cell ground conductive line of each circuit cell.

In order to supply the power and ground potentials to the circuit cells 521 an 522 respectively, the power/ground conductive line 511 may be connected directly to the in-cell power conductive line and in-cell ground conductive line of each circuit cell placed below the power/ground conductive line 511 via the through holes 551 and 552.

The operation of the semiconductor integrated circuit will be described below.

In the fifth embodiment, a by-pass condenser is formed by placing the power/ground conductive line 511 over the entire chip. Since the supply of the power and ground potentials to the individual circuit cells 521 and 522 may be performed via the through holes 551 and 552, the power and ground potentials can be supplied to their corresponding in-cell power and ground conductive lines of each circuit cell in a very short distance. As a result, the resistances of the power and ground conductive lines can be greatly reduced.

Figure 6:
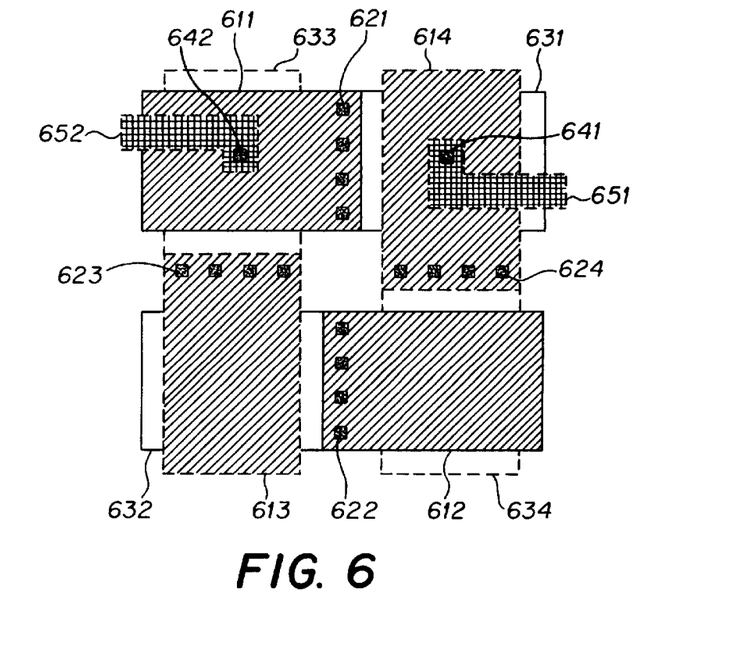
FIG. 6 is a layout of a semiconductor integrated circuit according to a sixth embodiment of the present invention.

FIG. 6 is a plan view of a semiconductor integrated circuit showing a sixth embodiment of the present invention.

As shown in the same drawing, the present embodiment includes, in order from the uppermost layer, a first wiring layer, a second wiring layer and signal wiring layers. Further, the embodiment comprises a first power conductive line 611, a second power conductive line 612, a first ground conductive line 613 and a second ground conductive line 614 all formed in the first wiring layer, a third power conductive line 631, a fourth power conductive line 632, a third ground conductive line 633 and a fourth ground conductive line 634 all formed in the second wiring layer, a first signal conductive line 651 and a second signal conductive line 652 formed in the third wiring layer, through holes 621 for connecting the first power conductive line 611 and the third power conductive line 631 to each other, through holes 622 for connecting the second ground conductive line 622 and the fourth power conductive line 632 to each other, through holes 623 for connecting the first ground conductive line 613 and the third ground conductive line 633 to each other, through holes 624 for connecting the second ground conductive line 614 and the fourth ground conductive line 634 to each other, a through hole 641 for connecting the third power conductive line 631 and the first signal conductive line 651 to each other, and a through hole 642 for connecting the third ground conductive line 633 and the second signal conductive line 652 to each other.

In FIG. 6, the conducive lines related to the first wiring layer are indicated by oblique lines, the conductive lines related to the second wiring layer are indicated by open frames, the conductive lines related to the third wiring layer are indicated by meshes, the power conductive lines are indicated by solid-line frames, the ground conductive lines are indicated by dotted-line frames, and the signal conductive lines are indicated by dashed lines.

The supply of power and ground potentials to the respective signal conductive lines is performed as follows: When the first signal conductive line 651 is fixed to the power potential, the third power conductive line 631 and the first signal conductive line 651 may be connected to each other. That is, the supply of the power potential to each signaD conductive line is carried out via the through hole 641. On the other hand, when the second signal conductive line 652 is fixed to the ground potential, the third ground conductive line 633 and the second signal conductive line 652 may be connected to each other. That is, the supply of the ground potential to each signal conductive line is carried out via the through hole 642.

In the sixth embodiment, a by-pass condenser is made up of capacitances created by portions where the power conductive lines and ground conductive lines disposed relative to each other overlap.

The operation of the semiconductor integrated circuit will be described below.

As described above, the first wiring layer and the second wiring layer are both used for the power and ground conductive lines employed in the sixth embodiment of the present invention. Further, the third wiring layer is used for the signal conductive lines.

In the present structure, the capacitance, which serves as the by-pass condenser, is principally obtained as the total or composite capacitance equal to the sum of a capacitance at the portion where the first power conductive line 611 and the third ground conductive line 633 overlap, a capacitance at the portion where the second power conductive line 612 and the fourth ground conductive line 634 overlap, a capacitance at the portion where the third power conductive line 631 and the second ground conductive line 614 overlap, and a capacitance at the portion where the fourth power conductive line 632 and the first ground conductive line 613 overlap. Power and ground noise can be reduced by increasing the total capacitance as large as possible.

Since the present embodiment is constructed in this way, the power and ground conductive Dines can be disposed so as to overlap each other. Further, the power and ground noise can be reduced by ensuring the capacitance that serves as the by-pass condenser.

Further, since the power and ground conductive lines disposed so as to adjoin each other are both provided in the first and second wiring layers, they can be easily connected to the signal conductive lines of the adjacent signal wiring layers. Further, both the power and ground conductive lines can be connected to the signal wiring layers disposed in the adjacent regions in the shortest distance from any directions.

Further, they can be also connected to the upper and lower layers in the shortest distance.

In the sixth embodiment, the power conductive lines may be replaced by the ground conductive lines.

Further, the capacitance serving as the by-pass condenser may be increased in capacity by using the power and ground conductive lines employed in the sixth embodiment as one set and successively connecting a plurality of sets of the power and ground conductive lines to one another so as to be spread over the entire chip.

The various configurations described in the aforementioned specification of the present application can bring about the following advantageous effects:

(1) According to a first invention of the present application, mutillayered first and second wiring layers are provided. The first wiring layer is used for a first power conductive line and the second wiring layer is used for a second power conductive line. Further, the first power conductive line and the second power conductive line are disposed so as to overlap each other. A by-pass condenser is formed inside a semiconductor integrated circuit based on a capacitance obtained by the first power conductive line and the second power conductive line. Therefore, the capacitance that serves as the by-pass condenser can be ensured and hence power and ground noise can be reduced.

(2) According to a second invention of the present application, a first wiring layer, a second wiring layer and a third wiring layer multilayered in turn are provided. The first wiring layer and the third wiring layer are used for first power conductive lines and the second wiring layer is used for a second power conductive mine. The first power conductive lines are respectively disposed so as to be superimposed on upper and lower layers of the second power conductive line. Further, a by-pass condenser is formed inside a semiconductor integrated circuit based on capacitances obtained by the first power conductive lines and the second power conductive mire. Therefore, the power conductive lines can be respectively disposed so as to be superimposed on upper and sower layers of a ground conductive mine. Further, power and ground noise can be reduced by ensuring the capacitance that serves as the by-pass condenser.

Further, the capacity of the by-pass condenser, which is larger than that of the by-pass condenser described in the paragraph (1), can be ensured. Therefore, this becomes effective in coping with a reduction in capacity of the by-pass condenser due to the fact that the signal conductive lines connected to each power conductive line increase in number and the area of the power conductive line in the ground wiring layer increases, whereby the proportion of the original ground conductive lines is reduced.

(3) According to a third invention of the present application, a first wiring layer, a second wiring layer and a third wiring layer multilayered in order are provided. The first wiring layer is used for a first power conductive line, the second wiring layer is used for a first power conductive line and a second power conductive line, and the third wiring layer is used for a second power conductive line. The first power conductive line of the first wiring layer and the second power conductive line of the third wiring layer are disposed so as to overlap each other. The first power conductive line and the second power conductive line of the second wiring layer are provided alternately relative to each other so that projections and depressions are defined between the power conductive line of the first wiring layer and the second power conductive line of the third wiring layer. Further, a by-pass condenser is formed inside a semiconductor integrated circuit based on capacitances obtained by the first power conductive line and the second power conductive line. Therefore, the capacitance, which serves as the by-pass condenser, can be ensured by disposing the power and ground conductive lines within the layer provided between the superimposed power conductive line and ground conductive line in the same manner in such a manner that the projections and depressions are defined between the power conductive line and ground conductive line, whereby power and ground noise can be reduced.

Similarly to the paragraph (2), the capacity of the by-pass condenser, which is larger than that of the by-pass condenser described in the paragraph (1), can be ensured in particular. Therefore, this becomes effective in coping with a reduction in capacity of the by-pass condenser due to the fact that the number of the signal conductive lines connected to each power conductive line increases and the area of the power conductive line in the ground wiring layer increases, so that the proportion of the original ground conductive lines is reduced.

(4) According to a fourth invention of the present application, the power conductive line is disposed around a chip in a ring form so that a by-pass condenser is formed inside a semiconductor integrated circuit. Therefore, power and ground noise can be reduced by disposing the by-pass condenser around the chip so as to ensure the capacitance serving as the by-pass condenser.

(5) According to a fifth invention of the present application, the power conductive line is disposed over the entire chip so that a by-pass condenser is formed inside a semiconductor integrated circuit. Therefore, the capacitance that serves as the by-pass condenser can be ensured with satisfactory efficiency as compared with the paragraph (4) by disposing the by-pass condenser over the entire chip. Further, since the power and ground conductive lines can be also considerably reduced in wiring resistance, power and ground noise can be lessened.

(6) According to a sixth invention of the present application, a first wiring layer and a second wiring layer formed in a multilayered form are provided. The first wiring layer and the second wiring layer are used for first and second power conductive lines respectively. The first and second power conductive lines are provided so as to overlap each other and alternately provided so as to adjoin each other. Further, a by-pass condenser is formed inside a semiconductor integrated circuit by the use of capacitances obtained by the first and second power conductive lines. Therefore, power and ground conductive lines can be disposed so as to be superimposed on one another and power and ground noise can be reduced by ensuing the capacitance which serves as the by-pass condenser.

Further, since the power and ground conductive lines disposed so as to adjoin each other in all directions are both included in the first and second wiring layers, they can be connected to the signal conductive lines of the adjacent signal wiring layers in the shortest distance.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit comprising:

a substrate;

a first layer above the substrate;

a second layer above the first layer;

a first conductive line disposed in said second layer;

a second conductive line disposed in said first layer such that only respective first edge portions of said first and second conductive lines overlap each other, said respective first edge portions being electrically connected to each other;

a third conductive line disposed in said second layer and formed over said second conductive line with a first insulating portion therebetween;

a fourth conductive line disposed in said first layer such that only respective second edge portions of said third and fourth conductive lines overlap each other, said respective second edge portions being electrically connected to each other; and a fifth conductive line disposed in said second layer and formed over said fourth conductive line with a second insulating portion therebetween;

wherein said first and second conductive lines are coupled to a first power voltage, and said third conductive line is coupled to a second power voltage different from the first power voltage so that a by-pass condenser is made of capacitance created between said second and third conductive lines; and wherein said fifth conductive line is coupled to said first power voltage so that said by-pass condenser is further made of capacitance created between said fourth and fifth conductive lines.

2. A semiconductor integrated circuit as defined by claim 1, further comprising:

a sixth conductive line disposed in said first layer such that only respective third edge portions of said fifth and sixth conductive lines overlap each other, said respective third edge portions being electrically connected to each other; and a seventh conductive line disposed in said second layer and formed over said fourth conductive line with a third insulating portion therebetween;

wherein said seventh conductive line is coupled to said second power voltage so that said by-pass condenser is further made of capacitance created between said sixth and seventh conductive lines.

3. A semiconductor integrated circuit as defined by claim 2, further comprising:

an eighth conductive line disposed in said first layer such that only respective fourth edge portions of said seventh and eighth conductive lines overlap each other, said respective fourth edge portions being electrically connected to each other, said first conductive line being formed over said eighth conductive line with a fourth insulating portion therebetween;

wherein said by-pass condenser is further made of capacitance created between said first and eighth conductive lines.

4. A semiconductor integrated circuit comprising:

a substrate;

a first layer above the substrate;

a second layer above the first layer;

a first conductive line disposed in said second layer;

a second conductive line disposed in said first layer such that only respective first edge portions of said first and second conductive lines overlap each other, said respective first edge portions being electrically connected to each other;

a third conductive line disposed in said second layer and formed over said second conductive line with a first insulating portion therebetween;

a fourth conductive line disposed in said second layer;

a fifth conductive line disposed in said first layer such that only respective second edge portions of said fourth and fifth conductive lines overlap each other, said respective second edge portions being electrically connected to each other; and a sixth conductive line disposed in said second layer and formed over said fifth conductive line with a second insulating portion therebetween:

wherein said first and second conductive lines are coupled to a first power voltage, and said third conductive line is coupled to a second power voltage different from the first power voltage so that a by-pass condenser is made of capacitance created between said second and third conductive lines; and wherein said fourth and fifth conductive lines are coupled to said first power voltage, and said sixth conductive line is coupled to said second power voltage so that said by-pass condenser is further made of capacitance created between said fifth and sixth conductive lines.

5. A semiconductor integrated circuit as defined by claim 4, further comprising:

a seventh conductive line disposed in said first layer such that only respective third edge portions of said third and seventh conductive lines overlap each other, said respective third edge portions being electrically connected to each other, said fourth conductive line being formed over said seventh conductive line with a third insulating portion therebetween;

wherein said by-pass condenser is further made of capacitance created between said fourth and seventh conductive lines.

6. A semiconductor integrated circuit as defined by claim 4, further comprising:

a seventh conductive line disposed in said first layer such that only respective third edge portions of said sixth and seventh conductive lines overlap each other, said respective third edge portions being electrically connected to each other, said first conductive line being formed over said seventh conductive line with a third insulating portion therebetween;

wherein said by-pass condenser is further made of capacitance created between said first and seventh conductive lines.

7. A semiconductor integrated circuit comprising:

a substrate;

a first layer above the substrate;

a second layer above the first layer;

a first conductive line disposed in said second layer;

a second conductive line disposed in said first layer such that only respective first edge portions of said first and second conductive lines overlap each other, said respective first edge portions being electrically connected to each other;

a third conductive line disposed in said second layer and formed over said second conductive line with a first insulating portion therebetween;

a fourth conductive line disposed in said first layer, said first conductive line being formed over said fourth conductive line with a second insulating portion therebetween;

wherein said first and second conductive lines are coupled to a first power voltage, and said third conductive line is coupled to a second power voltage different from the first power voltage so that a by-pass condenser is made of capacitance created between said second and third conductive lines; and wherein said fourth conductive line is coupled to said second power voltage so that said by-pass condenser is further made of capacitance created between said first and fourth conductive lines.

8. A semiconductor integrated circuit comprising;

a substrate;

a first layer above the substrate;

a second layer above the first layer;

a first conductive line disposed in said second layer;

a second conductive line disposed in said first layer such that only respective first edge portions of said first and second conductive lines overlap each other, said respective first edge portions being electrically connected to each other;

a third conductive line disposed in said second layer and formed over said second conductive line with a first insulating portion therebetween;

a fourth conductive line disposed in said first layer and coupled to said first power voltage; and a fifth conductive line disposed in said second layer and coupled to said second power voltage, said fifth conductive line being formed over said fourth conductive line with a second insulating portion therebetween;

wherein said first and second conductive lines are coupled to a first power voltage, and said third conductive line is coupled to a second power voltage different from the first power voltage so that a by-pass condenser is made of capacitance created between said second and third conductive lines; and wherein said by-pass condenser is further made of capacitance created between said fourth and fifth conductive lines.

* * * * *

UNITED STATES PATENT AND TRADEMARK OFFICE
CERTIFICATE OF CORRECTION

PATENT NO. : 5,949,098  
DATED : September 7, 1999  
INVENTOR(S) : Hiroyuki Mori Page 1 of 1

It is certified that error appears in the above-identified patent and that said Letters Patent is hereby corrected as shown below:

Item [56] References Cited, under "U.S. PATENT DOCUMENTS",

| -- 4,905,068 | 2/1990 | Satoh et al............................257/296 |
| 5,262,353 | 11/1993 | Sun et al..............................257/759 |
| 5,670,815 | 9/1997 | Childs et al..........................257/776 |
| 5,874,778 | 2/1999 | Bhattacharyya et al.................257/758 --; |

Column 10,
Lines 20, 22, 28, 30, 48, 50, 62 and 64, delete "edge".

Column 11,
Lines 13, 15, 22, 24, 43, 45, 55 and 57, delete "edge".

Column 12,
Lines 10, 12, 37 and 39, delete "edge".

Signed and Sealed this

Fourteenth Day of August, 2001

*Attest:*

NICHOLAS P. GODICI
*Attesting Officer*    *Acting Director of the United States Patent and Trademark Office*